(12) United States Patent
Sorg et al.

(10) Patent No.: US 7,471,469 B2
(45) Date of Patent: Dec. 30, 2008

(54) DEVICE FOR THE LOW-DEFORMATION REPLACEABLE MOUNTING OF AN OPTICAL ELEMENT

(75) Inventors: Franz Sorg, Aalen (DE); Andreas Wurmbrand, Aalen-Reichenbach (DE); Thomas Petasch, Aalen (DE); Dirk Schaffer, Aalen (DE); Siegfried Wahl, Donzdorf (DE)

(73) Assignee: Carl Zeiss SMT AG, Oberkochen (DE)

( * ) Notice: Subject to any disclaimer, the term of this patent is extended or adjusted under 35 U.S.C. 154(b) by 181 days.

(21) Appl. No.: 11/233,846

(22) Filed: Sep. 22, 2005

(65) Prior Publication Data

US 2006/0158749 A1 Jul. 20, 2006

Related U.S. Application Data

(63) Continuation-in-part of application No. PCT/EP03/03110, filed on Mar. 26, 2003.

(51) Int. Cl.
G02B 7/02 (2006.01)
(52) U.S. Cl. ........................... 359/811; 359/819
(58) Field of Classification Search ................. 359/811, 359/819, 822
See application file for complete search history.

(56) References Cited

U.S. PATENT DOCUMENTS 5,184,196 A * 2/1993 Nakagawa et al. .......... 356/401
5,262,899 A * 11/1993 Iizuka ......................... 359/811
5,973,863 A 10/1999 Hatasawa et al. ........... 359/823
6,574,053 B1 * 6/2003 Spinali ........................ 359/819
6,594,093 B2 7/2003 Moeller et al. .............. 359/824
6,667,839 B2 12/2003 Hartmaier et al. ........... 359/820
6,717,159 B2 * 4/2004 Novak ....................... 250/492.2
6,733,369 B1 5/2004 Stacklies et al. .............. 451/42
6,798,588 B2 9/2004 Vogt ............................ 359/819
6,870,632 B2 3/2005 Petasch et al. ............... 356/614
6,897,599 B2 5/2005 Sorg et al. .................... 310/326
6,940,607 B2 9/2005 Freimann et al. ............ 356/521
7,116,500 B2 * 10/2006 Murasato

FOREIGN PATENT DOCUMENTS

EP 1107034 11/2000
EP 1164397 4/2001

* cited by examiner

Primary Examiner—Timothy J Thompson
(74) Attorney, Agent, or Firm—Wells St. John, P.S.

(57) ABSTRACT

The invention relates to a device for the low-deformation replaceable mounting of an optical element, in particular a closure plate of an objective of a projection exposure system for microlithography for the production of semiconductor components, in a mount (12). The optical element is connected to the mount (12) at least partly via an adhesive connection. This is located between the adjacent circumferential walls of mount (12) and optical element. The mount (12) is provided with at least three support feet (14) distributed over the circumference, by means of which the optical element is mounted laterally and axially. The mount (12) is connected to the housing of the objective in an at least approximately deformation-decoupled manner via three mount bearing points (15).

45 Claims, 4 Drawing Sheets

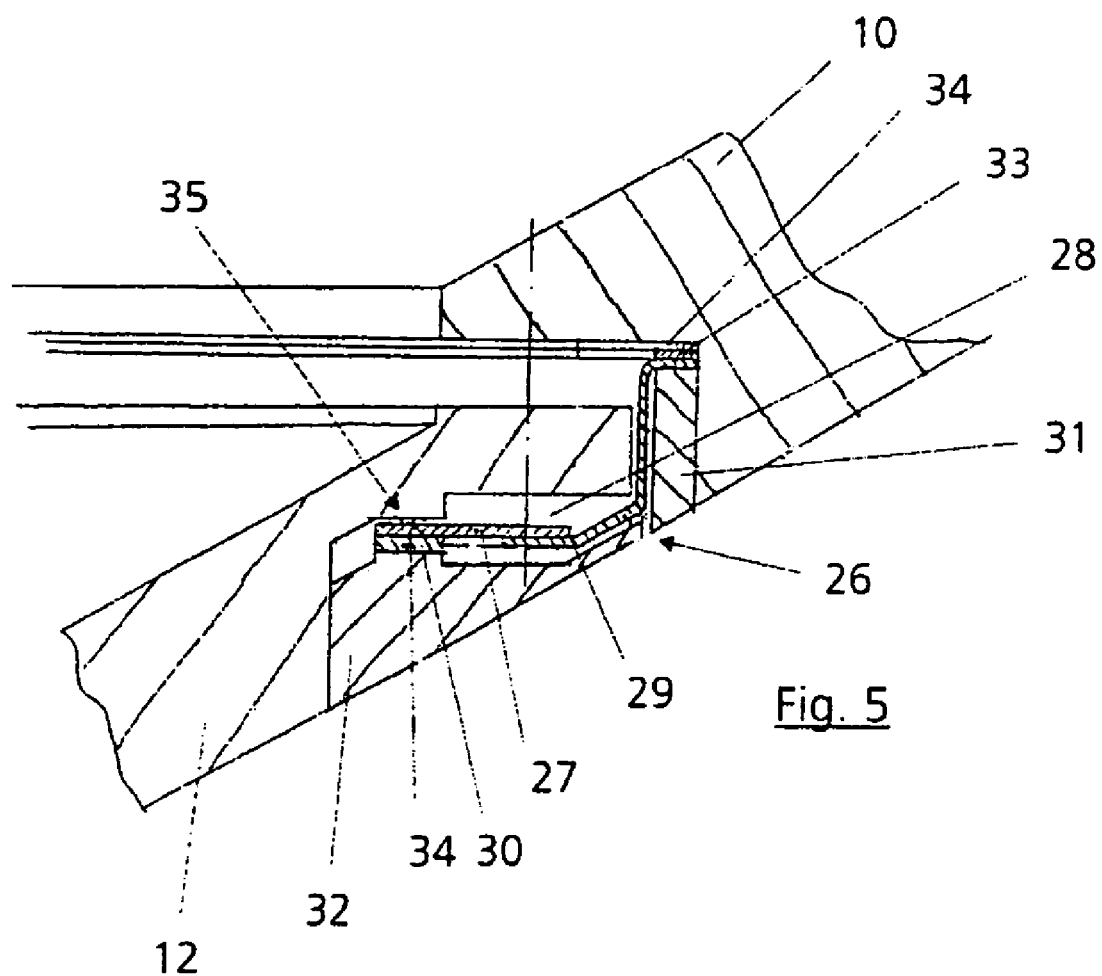

DEVICE FOR THE LOW-DEFORMATION REPLACEABLE MOUNTING OF AN OPTICAL ELEMENT

PRIORITY CLAIM

This is a Continuation-in-Part which claims priority from International Application No. PCT/EP2003/003110, entitled: Device for the Low-Deformation Replaceable Mounting of an Optical Element, filed Mar. 26, 2003, by Thomas Petasch, Dirk Schaffer, Andreas Wurmbrand, and Franz Sorg, the disclosure of which is incorporated herein by reference.

BACKGROUND OF THE INVENTION

1. Field of the Invention

The invention relates to a device for the low-deformation replaceable mounting of an optical element, in particular a closure plate of an objective of a projection exposure system for microlithography for the production of semiconductor components, in a mount of the type defined in more detail in the preamble of claim 1.

2. Description of the Related Art

A generic device is described in EP 1 107 034 A2. According to that, it is already known to provide the mount with at least three support feet distributed around the circumference on which feet the optical element lies and to introduce the adhesive layer in an annular gap between the mutually adjoining circumferential walls of mount and optical element, at least in some regions. The object of the previously known device is to mount the optical element at least largely free of deformation and avoiding stresses in the mount, in particular to achieve a mounting by means of which distortions changing over time can at least largely be eliminated. However, the mount described there can be set to the required lateral position only by means of an adjustment process and is accordingly not suitable for adjustment-free replacement. Because of the use of more than three fixing screws for holding the mount, the mounting of the mount that is described is subject to disadvantageous single-wave and multi-wave deformation which results from this.

Known holders and fixings of optical elements to mounts, in particular by means of adhesives, transmit forces and/or moments via the fixing to the optical elements. As a result of the adhesive connection of the optical elements, stresses can occur, which can lead to image defects of the respective optical element.

In the case of objectives in microlithography for the production of semiconductor components, from time to time subsequent corrections have to be provided in order to eliminate imaging defects or to increase the imaging accuracy. For this reason, individual optical elements, such as the closure plate, have to be designed to the replaceable in order that, for example, objective imaging defects can be optimized. The same is also true in the event of damage or wear of an optical element. This applies in particular to a closure plate in a projection objective. In the event of a replacement of this type, however, reproducibility should be achieved in order that new defects do not creep in.

For this purpose, it is already known from U.S. Pat. No. 5,973,863 to connect the closure plate of an objective in microlithography for the production of semiconductor components to the mount in a replaceable manner, in order that spherical aberrations or other image defects of the projection system can be corrected. To this end, a screw connection of the closure plate to the mount is proposed.

SUMMARY OF THE INVENTION

The present invention is based on the object of providing a device for the low-deformation mounting of an optical element in a mount of the type mentioned at the beginning which solves the disadvantages of the prior art and, if required, provides simple replaceability of an optical element, if possible without an additional mounting process, with high reproducibility by means of sufficient deformation decoupling.

According to the invention, this object is achieved in that the mount is connected to the housing of the objective in an at least approximately deformation-decoupled manner via three mount bearing points.

By means of the measures according to the invention, turning away from the normal design, a mount is provided which is connected to the objective housing only via a three-point mounting. As a result, very good deformation decoupling of the optical element from the objective housing and from the mount is achieved, which leads to simple reproducibility of the mounting of the optical element and thus to simple replaceability. Accordingly, the optical element can be replaced in the field without an additional adjustment process. By means of the three-point mounting of the mount in the projection objective, therefore a level of deformation decoupling is achieved which is absolutely necessary for changing the optical element.

In a constructional refinement of the convention, provision can also be made for the mount bearing points each to have at least one active spacer element, in particular piezoelectric elements, and/or at least one passive spacer element, in particular a spacer washer, and for the position and tilt of the mount and of the optical element to be capable of regulation or control in all six degrees of freedom by means of the active or passive spacer elements of the mount bearing points, in particular in a range of less than 200 μm.

By means of these measures, in a simple and advantageous way, mounting effects and fabrication tolerances can be compensated for. Via the active (actuator) or passive, highly accurately machined spacer elements, in particular via their respective heights/thicknesses, the tilt, the axial position and the rotation of the mount and therefore the optical element can be set, regulated or controlled.

It is advantageous if the mount bearing points have at least one fixing element, in particular a dowel pin screw.

Via the fixing elements, in particular the dowel pin screws, the mount and thus the optical element are positioned in the lateral and rotational direction. Accordingly, adjustment of the mount with respect to the projection objective is no longer necessary. The mount is fixed to the projection objective and to the housing of the latter via the spacer element, the fixing element and a spring element.

It is advantageous if the mount bearing points have a deformation decoupling element, in particular a diaphragm, and the diaphragm is formed by mount regions of lower thickness in the region of the mount bearing points.

The deformation decoupling element or the diaphragm represents simple mechanical decoupling in order to minimize the influences of deformation on the mount produced by local tilting and forces. Deformations which occur in the mount bearing points are converted into tilting of the mount.

According to the invention, provision can further be made for the mount to be sealed off with respect to the objective by means of a sealing subassembly having a plurality of sealing components, and for the sealing subassembly to have at least one sealing diaphragm.

The mounting by means of three points can additionally require the solution of a sealing problem between projection objective and mount. The sealing subassembly seals the projection objective with respect to the mount. A sealing diaphragm of the sealing subassembly additionally represents mechanical decoupling of the mount with respect to the projection objective.

It is advantageous if the sealing subassembly has a pressure ring and the sealing surface between pressure ring and sealing membrane is provided with structuring, in particular with at least one sealing lip.

By means of the structuring or the sealing lip, additional tightness is achieved when the sealing subassembly is compressed.

It is advantageous if the connection between the mount and the optical element is sealed off by a sealing element and the sealing element is mounted via direct metallic contact with the mount.

The seal between mount and optical element is carried out via an adhesive gap, which is formed by the sealing element and the optical element. The direct metallic contact between the sealing element and the mount is necessary in order that the adhesive gap is not installed with a tilt with respect to the optical element.

According to the invention, provision can also be made for adhesive accommodation spaces to be provided on the adhesive surface between the optical element and sealing element and/or on the adhesive surface between the mount and sealing element.

Adhesive accommodation spaces or adhesive accommodation pockets prevent the adhesive being able to spread out beyond the actual adhesive contact surfaces by capillary action. Ideally, however, these adhesive accommodation spaces should be free of adhesive.

In a development of the invention, provision can be made for the adhesive to act on the neutral fiber of the optical element.

Therefore, stresses and deformations introduced to the optical element through structure changes of the adhesive or through adhesive shrinkage are avoided. The adhesive properties should be set optimally with regard to sealing action and deformation decoupling.

Advantageous refinements and developments of the invention emerge from the further subclaims and from the following exemplary embodiment, described in principle by using the drawings.

BRIEF DESCRIPTION OF THE DRAWINGS

FIG. 5 shows a basic sectional view of a sealing subassembly of the device according to the invention.

DETAILED DESCRIPTION

Figure 1:
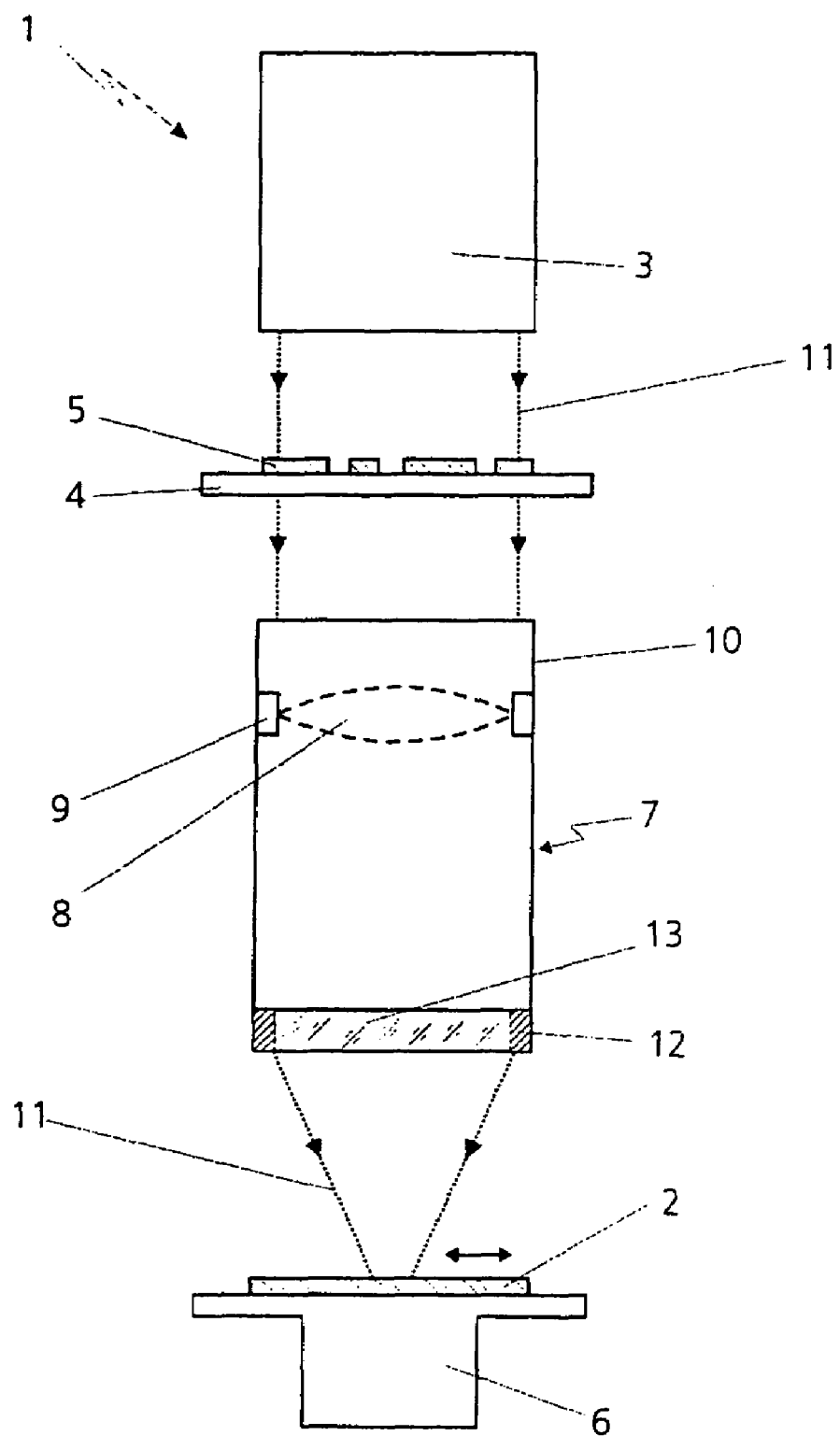
FIG. 1 shows a basic illustration of a projection exposure system for microlithography, which can be used to expose structures on wafers coated with photosensitive materials.

FIG. 1 illustrates a projection exposure system 1 for microlithography. This is used to expose structures on a substrate coated with photosensitive materials, which generally predominantly consists of silicon and is designated a wafer 2, for the production of semiconductor components, such as computer chips.

The projection exposure system 1 in this case substantially comprises an illuminating device 3, a device 4 for holding and exactly positioning a mask provided with a grid-like structure, what is known as a reticle 5, by which the subsequent structures on the wafer 2 are determined, a device 6 for holding, moving and exactly positioning just this wafer 2, and an imaging device, specifically a projection objective 7 having a plurality of optical elements, such as lenses 8, which are mounted via a mount 9 in an objective housing 10 of the projection objective 7.

The fundamental functional principle in this case provides for the structures introduced into the reticle 5 to be exposed on to the wafer 2 with a reduction in the size of the structures.

After the exposure has been carried out, the wafer 2 is moved onward in the direction of the arrow, so that a large number of individual fields on the same wafer 2 are in each case exposed with the structure predefined by the reticle 5. On account of the stepwise feed movement of the wafer 2 in the projection exposure system 1, this is often also designated a stepper.

The illuminating device 3 provides a projection beam 11, for example light or similar electromagnetic radiation, for the imaging of the reticle 5 on the wafer 2. A laser or the like can be used as a source for this radiation. The radiation is shaped by optical elements in the illuminating device 3 in such a way that the projection beam 11 has the desired properties with regard to diameter, polarization, shape of the wavefront and the like when it strikes the reticle 5.

Via the projection beam 11, an image of the reticle 5 is produced and transferred from the projection objective 7, reduced appropriately in size, onto the wafer 2, as has already been explained above. The projection objective 7 has a large number of individual refractive and/or diffractive optical elements, such as lenses, mirrors, prisms and the like. The last optical element in the beam direction is a closure plate 13 mounted in a mount 12 by means of a device according to the invention.

Figure 2:
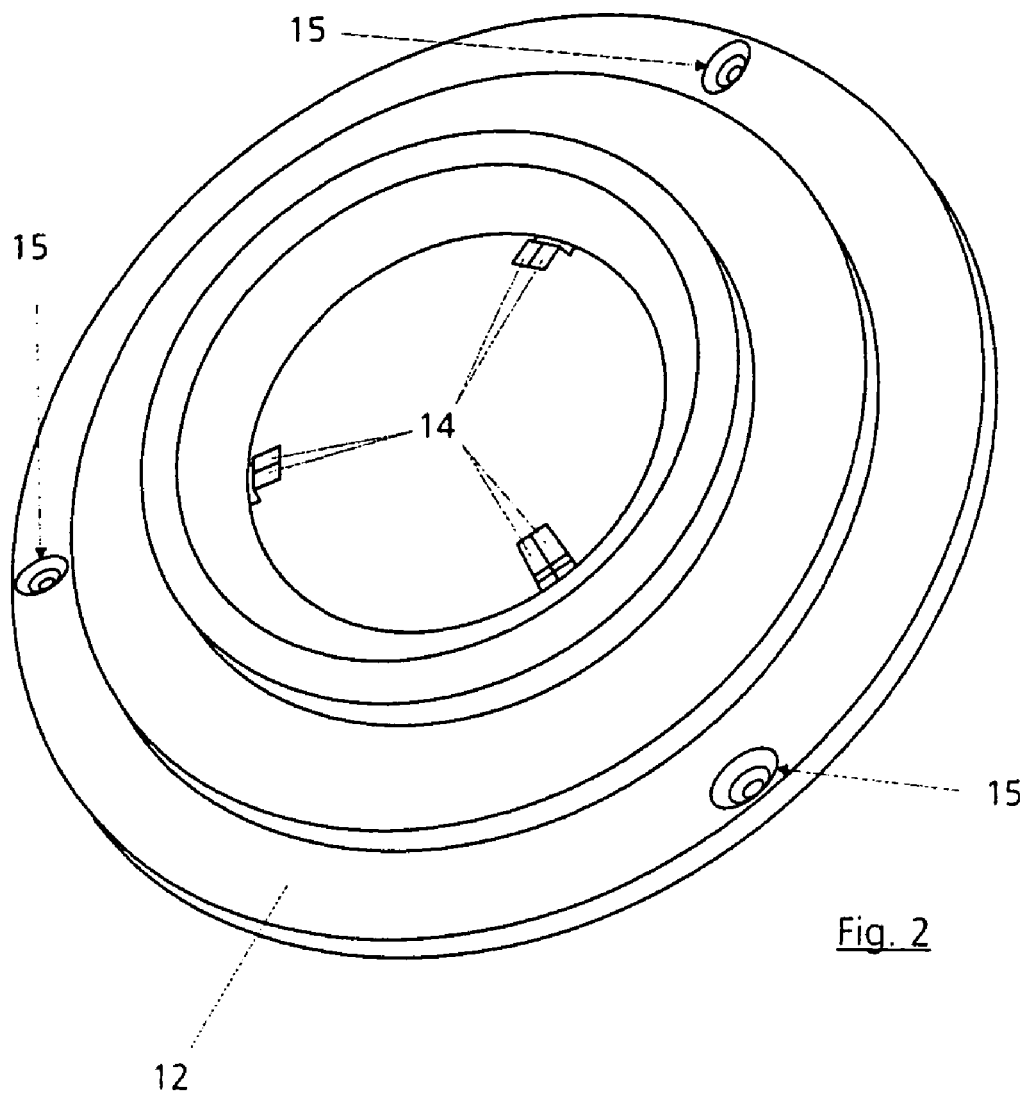
FIG. 2 shows a basic illustration of a mount having a device according to the invention.

As can be seen from FIG. 2, a mount 12 having the device according to the invention has six spring elements 14 in three groups arranged offset at an angle of 120° distributed over the circumference of the mount 12, to which spring elements 14 the closure plate 13 (illustrated in FIG. 3) is fixed. The closure plate 13 is mounted laterally and axially via the form of the spring elements 14. The spring elements 14 are formed in one piece with the mount 12. The mount 12 has a relatively high thickness of 10 mm. In general, mount thicknesses of greater than 1 mm are suitable. The mount 12 is mounted and fixed on the objective housing 10 of the projection objective 7 via three mount bearing points 15. As a result of the three point mounting in the mount bearing points 15, a high level of deformation decoupling of the mount 12 and of the closure plate 13 mounted therein is achieved, which means that simple replacement of the closure plate 13 is made possible for the first time. The spring elements 14 are in one piece with the mount 12 and project beyond the inner circumferential wall of the mount 12. The diameters of the inner circumferential wall of the mount 12 and the circumferential wall of the closure plate 13 are chosen in relation to each other such that an annular gap remains between them (see FIG. 3).

The abovementioned deformation decoupling is achieved, for example, by the fact that the mount 12 has a reduced stiffness, for example in the radial and/or tangential and/or axial direction, on the mount bearing points 15. In this case, the axial direction points in the direction of the optical axis, for example. The reduction in the stiffness can be provided, for example, in that in a limited region around the mount bearing points 15, the mount 12 is formed with a reduced thickness. The reduced thickness can be provided, for example, by milled out portions in the direction of the objective housing 10. As a result, the mount 12 comes to bear on the objective housing 10 in the region of the milled out portions with a reduced mounting thickness. In this case, the milled out portions can be designed to be conical or cylindrical, for example, and preferably have a hole through which a retaining element, for example a dowel pin 23 described in more detail below, projects. By means of the retaining element, the mount 12 is connected to the objective housing in the region of the bearing points 15. Alternatively, the mount 12 can also be connected to a mounting element of an optical element.

The bearing points 15 of the mount 12 are provided on the side facing the objective housing 10 (or the mounting element of an optical element) with a planar surface, which lies in one plane with the surface of the mount which likewise faces the objective housing 10 (or the mounting element of an optical element).

Alternatively or additionally, the bearing point 15 on the side facing the objective housing or, generally, the side facing a mating bearing, can have a profile which is matched to a profile of the mating bearing. For instance, the bearing point 15 can have a convexly shaped surface which engages at least partly in a concave surface of a mating bearing. A bearing point 15 profiled in this way can also rest on a planar surface, for example, which is used as a mating bearing and, for example, is formed by parts of the objective housing 10.

Alternatively or additionally, the reduced stiffness of the mount bearing points 15 can be formed by regions in which the mount material is at least partly or wholly removed along the thickness of the mount 12. In this way, a type of solid body joints can be formed in the region of the mount bearing points 15, so that the stiffness of the mount bearing points 15 relative to the stiffness of the mount at other points is reduced in predefined directions.

In general terms, the mount according to the invention has bearing points 15 which have means which reduce the stiffness of the mount in the region of the mount bearing points 15 in the tangential, lateral or axial direction (or any other desired direction). As already mentioned, the mount preferably has three bearing points. The mount 12 according to the invention is connected to the mount bearing points 15 in each case with mating bearings, for example the mating bearings being formed by parts of an objective housing 10 or parts of a mounting element of a further optical element.

The surfaces of the mount bearing points 15 facing the mating bearings are preferably planar or convex surfaces or comprise such.

As a means for the reduction of the stiffness, the mount bearing points 15 comprise regions in which the mounting material has been partly or wholly removed along the thickness of the mount. This can be achieved, for example, in that, in the region of the mount bearing point, the thickness of the mount is reduced by means of milled out portions in the direction of the mating bearing. As a result, the mount bearing point 15 advantageously remains in one piece with the mount 12, and the stiffness of the mount in the tangential, lateral or axial direction may be reduced and shaped virtually as desired for the region of the mount bearing points 15. However, this can also be carried out in any other desired direction. The stiffness there is preferably less than 50%, as based on the application, less than 20% of the respective stiffness of the mount 12.

Alternatively or additionally, the mating bearing can also be formed in a manner analogous to the mount bearing point 15. Thus, the mating bearing can likewise have means which reduce the stiffness of the mating bearing in any desired direction, preferably in the tangential, lateral or axial direction, in the region of the mating bearing, as compared with the corresponding stiffness of the mating bearing element in the corresponding direction. In this case, the mating bearing element comprises the mating bearing. The explanations given above for the mount 12 and the mount bearing points can be transferred in the corresponding way to the mating bearing element and the mating bearing. The mount bearing points 15 can in this case be formed without any stiffness-reducing means.

In a further refinement of the invention, a spacer washer 22 described in more detail below can be introduced between the mount bearing points 15 and the mating bearing points.

Alternatively or additionally, the spacer washer can comprise means which reduce its stiffness in a predefined direction as compared with the stiffness in another direction. The means for reducing the stiffness comprise means mentioned in connection with the mount bearing points.

In addition to the embodiments of the invention illustrated explicitly up to this point and in the following text, embodiments can also be implemented which result from combinations of features of individual embodiments or by replacing features of one embodiment by features of another embodiment.

Figure 3:
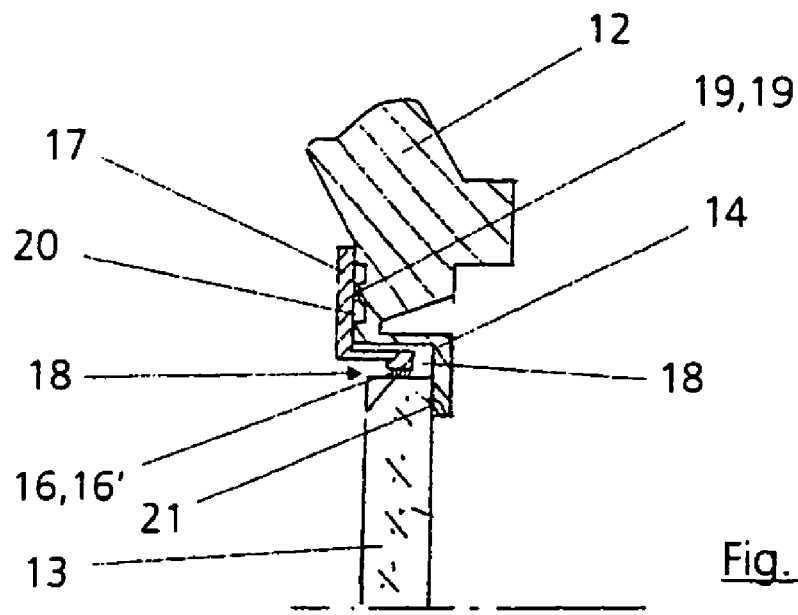
FIG. 3 shows a basic sectional view of a connection between mount and optical element according to the device of the invention.

As can be seen from FIG. 3, the sealing between the mounts 12 and the closure plate 13 is carried out via an adhesive gap 16 with an adhesive 16', which is located between a sealing element 17 and the closure plate 13. Adhesive accommodation pockets 18 prevent the adhesive 16' being able to spread out beyond the actual adhesive contact surface by capillary action. In the ideal case, however, these adhesive accommodation pockets 18 should be free of adhesive. The adhesive 16' acts in the neutral fiber of the closure plate 13, as a result of which stresses introduced by adhesive shrinkage and deformations cannot transfer any deformations to the closure plate 13. The adhesive properties are set optimally with regard to the sealing action and deformation decoupling.

The sealing element 17 is mounted via direct metallic contact with the mount 12. The adhesive contact surface of the sealing element 17 is centered with respect to the circumference of the closure plate 13. The sealing element 7 is fixed by means of an adhesive gap 19 having adhesive 19'; the sealing between the mount 12 and the sealing element 17 is provided therewith. The adhesive 19' is able to spread out in adhesive accommodation pockets 20, which means that direct metallic contact between the sealing element 17 and mount 12 is ensured. This direct metallic contact is necessary in order that the adhesive gap 19 is not put in place tilted with respect to the closure plate 13. It is therefore ensured, for example, that the adhesive 16' between sealing element 17 and closure plate 13 acts on the neutral fiber of the closure plate 13.

The adhesives 16' and 19' have rubber-like properties in order to support the sealing action and deformation decoupling and are in particular soft. The closure plate 13 is connected inelastically via an epoxy resin adhesive at the support surface 21 between closure plate 13 and spring element 14. In another exemplary embodiment, this inelastic connection could also be made by means of laser welding/soldering or ultrasonic welding. In a further exemplary embodiment, instead of a closure plate, another optical element, in particular a refractive and/or diffractive optical element, such as lenses, mirrors, prisms or the like, could also be mounted.

The mount 12 is mounted and fixed on the projection objective 17 or on the objective housing 10 of the projection objective 7 via three mount bearing points 15. As can be seen from FIG. 4, the mount bearing point 15 has a spacer washer 22 as a spacer element, a dowel pin screw 23 as fixing element and a nut 24 as spring element. In a further exemplary embodiment, other fixing elements or spring elements could of course also be used.

By using the spacer washers 22 as passive spacer elements, the tilt and the axial position of the mount 12, and therefore also the closure plate 13 mounted therein, can be adjusted. In a further exemplary embodiment, this could of course also be done via active spacer elements, such as piezoelectric stacks or the like. If appropriate, these should be operated at very low frequencies. The position and tilt of the mount 12 and of the closure plate 13 can be regulated and/or controlled in all six degrees of freedom by means of the active or passive spacer elements of the mount bearing points 15. The mount can be adjusted laterally in a range of less than 200 µm. A diaphragm 25 for the purpose of deformation decoupling forms the basic precondition for the use of the spacer washers 22 and thus for the construction of the mount bearing points 15. The diaphragm 25 is a mechanical decoupling means in order to minimize the influence of deformations of the mount 12 produced by local tilting and forces. Deformations which occur in the mount bearing points 15 are converted into tilting of the mount 12.

Figure 4:
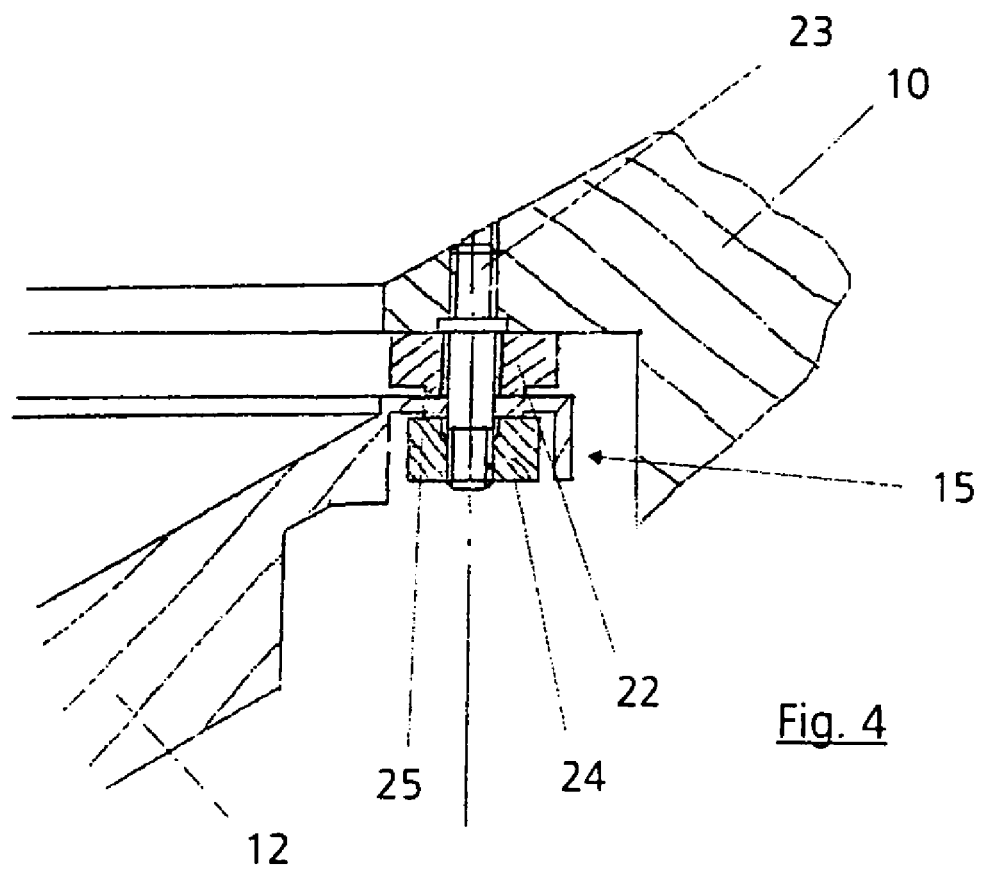
FIG. 4 shows a basic sectional view of a mount bearing point of the device according to the invention.

In the present exemplary embodiment, the diaphragm 25, as can be seen from FIG. 4, is formed by the mount regions of lower thickness in the region of the mount bearing points 15 of the mount 12.

By using the dowel pin screws 23, the mount 12 and thus the closure plate 13 is positioned in the lateral and in the rotational direction. Adjustment of the mount 12 in relation to the projection objective 7 is thus not necessary.

The three point mounting of the mount 12 requires a solution for the sealing problem between the objective housing 10 of the projection objective 7 and the mount 12. For this purpose, as illustrated in more detail in FIG. 5, a sealing subassembly 26 is provided. A sealing diaphragm 27 ensures mechanical decoupling of the mount 12 from the projection objective 7 and the objective housing 10. Deformations and displacements between projection objective 7 and mount 12 are transferred into an extension of the diaphragm 27 with low stresses resulting from this. Therefore, a seal 28 produces only slight deformations of the mount 12 and of the closure plate 13. The sealing diaphragm 27 consists of a sealing material which is suitable for semiconductor technology; its stiffness is very much lower than that of the mount bearing points 15. As can be seen further from FIG. 5, the sealing subassembly has a metal ring 29 and a metallic pressure ring 30. The mechanical connection between the sealing diaphragm 27, metal ring 29 and the metallic pressure ring 30 is achieved in the present exemplary embodiment via a vulcanization process. In another exemplary embodiment, this could also be carried out via other processes. Furthermore, the elements of the sealing subassembly could also consist of in particular elastic materials with rubber-like properties or else rubber-metal combinations. Screw rings 31, 32 compress the sealing diaphragm 27, the metallic pressure ring 30 and a sealing material 33 onto sealing surfaces 34. The sealing surfaces 34 between the metallic pressure ring 30 and the sealing diaphragm 27 are provided with sealing lips 35 in order to improve the tightness. In a further exemplary embodiment, other structuring of the sealing surfaces 34 could also be provided in order to improve the sealing capacity.

What is claimed is:

1. A device for the low-deformation mounting of an optical element, in particular a closure plate of an objective of a projection exposure system for microlithography for the production of semiconductor components, in a mount, wherein the optical element is connected to the mount at least partly via an adhesive connection, which is located between the adjacent circumferential walls of mount and optical element, and wherein the mount is provided with at least three support feet distributed over the circumference, by means of which the optical element is mounted laterally and axially, the mount being connected to the housing of the objective in an at least approximately deformation-decoupled manner via three mount bearing points.

2. The device as claimed in claim 1, wherein the mount bearing points each have at least one active and/or at least one passive spacer element.

3. The device as claimed in claim 1, wherein the mount bearing points in each case have at least one fixing element, in particular a dowel pin screw.

4. The device as claimed in claim 1, wherein the mount bearing points each have at least one spring element.

5. The device as claimed in claim 1, wherein the mount bearing points each have at least one nut.

6. The device as claimed in claim 2, wherein the position and tilt of the mount and of the optical element are capable of regulation or control in all six degrees of freedom by means of the active or passive spacer elements of the mount bearing points, in particular in a range of less than 200 .mu.m.

7. The device as claimed in claim 2, wherein the passive spacer element is formed as a spacer washer.

8. The device as claimed in claim 2, wherein the active spacer element has piezoelectric elements or a combination of piezoelectric elements, in particular of piezoelectric stacks.

9. The device as claimed in claim 1, wherein the mount bearing points have a deformation decoupling element.

10. The device as claimed in claim 9, wherein the deformation decoupling element is formed as a diaphragm.

11. The device as claimed in claim 10, wherein the diaphragm is formed by mount regions of lower thickness in the region of the mount bearing points.

12. The device as claimed in claim 9, wherein the deformation decoupling element has recesses.

13. The device as claimed in claim 1, wherein the mount is sealed off with respect to the objective housing by means of a sealing subassembly having a plurality of sealing components.

14. The device as claimed in claim 13, wherein the sealing components of the sealing subassembly are formed from metal or from elastic materials, in particular rubber.

15. The device as claimed in claim 13, wherein the mechanical connections of the sealing components of the sealing subassembly to one another are produced by vulcanization.

16. The device as claimed in claim 13, wherein the sealing subassembly has at least one sealing diaphragm as sealing component.

17. The device as claimed in claim 13, wherein the sealing subassembly has at least one sealing material as sealing component.

18. The device as claimed in claim 13, wherein the sealing subassembly has a ring as sealing component.

19. The device as claimed in claim 13, wherein the sealing subassembly has a pressure ring as sealing component.

20. The device as claimed in claim 19, wherein, in order to compress the sealing subassembly, screw rings are provided, the sealing diaphragm, the pressure ring and the sealing material being compressed on their sealing surfaces.

21. The device as claimed in claim 19, wherein the sealing surface between the pressure ring and sealing diaphragm is provided with structuring, in particular with at least one sealing lip.

22. The device as claimed in claim 1, wherein the support feet are formed in one piece with the mount.

23. The device as claimed in claim 1, wherein the support feet are formed as spring elements.

24. The device as claimed in claim 1, wherein the mount is provided with in particular three groups of at least two support feet in each case.

25. The device as claimed in claim 1, wherein the connection between the mount and the optical element is sealed off by a sealing element.

26. The device as claimed in claim 25, wherein the sealing element is mounted via direct metallic contact with the mount.

27. The device as claimed in claim 25, wherein adhesive accommodation spaces are provided on the adhesive surface between optical element and sealing element and/or on the adhesive surface between mount and sealing element.

28. The device as claimed in claim 1 wherein an adhesive acts on the neutral fiber of the optical element.

29. An objective, in particular a projection objective of a projection exposure system for microlithography for the production of semiconductor components, having an objective housing in which a plurality of optical elements are arranged and are connected to the objective housing via mounts, at least one of the optical elements, in particular the closure plate, being mounted in a device as claimed in claim 1 in an at least approximately deformation-decoupled and replaceable manner.

30. A device for the low-deformation mounting of an optical element in a mount, the mount in each case having a predefined stiffness in the tangential lateral and axial direction, and the mount being connected to respective mating bearings via mount bearing points, and the mount bearing points having means which reduce the stiffness of the mount in the tangential, lateral or axial direction in the region of the mount bearing points;
wherein the means of the mount bearing points comprise regions in which the mount material is partly or wholly removed along the thickness of the mount; and
wherein the stiffness of the mount in the tangential, lateral or axial direction in the region of the mount bearing points is reduced to less than 50%, preferably less than 20%, of the respective stiffness of the mount.

31. The device as claimed in claim 30, wherein the mount has three bearing points.

32. The device as claimed in claim 30, wherein the surface of the mount bearing point that faces the mating bearing comprises a plane or convex surface.

33. The device as claimed in claim 30, wherein the mount is formed with a reduced thickness in the region of the mount bearing point by means of milled out portions in the direction of the mating bearing.

34. The device as claimed in claim 30, wherein the mount bearing points are formed in one piece with the mount.

35. The device as claimed in claim 30, wherein the mount bearing point comprises a cylindrical or conical recess.

36. The device as claimed in claim 30, wherein the mating bearing is formed by parts of an objective housing or parts of a mounting element of a further optical element.

37. The device as claimed in claim 36, wherein the low-deformationally mounted optical element is a closure plate of an objective of a projection exposure system for microlithography.

38. A device for the low-deformation mounting of an optical element in a mount with mount bearing points which are connected to respective mating bearings of a mating bearing element, wherein the respective mating bearings have means which reduce the stiffness of the mating bearing element in at least one predefined direction in the region of each mating bearing;
wherein the mount in each case having a predefined stiffness in the tangential lateral and axial direction, and the mount being connected to the respective mating bearings via the mount bearing points, and the mount bearing points having means which reduce the stiffness of the mount in the tangential, lateral or axial direction in the region of the mount bearing points; and
wherein the means of the mount bearing points comprise regions in which the mount material is partly or wholly removed along the thickness of the mount.

39. The device as claimed in claim 38, wherein the predefined direction points in the tangential, lateral or axial direction in relation to an optical axis of the optical element.

40. A device for the low-deformation mounting of an optical element in a mount with mount bearing points which are connected to respective mating bearings of a mating bearing element, wherein the respective mating bearings have means which reduce the stiffness of the mating bearing element in at least one predefined direction in the region of each mating bearing;
wherein the mount in each case having a predefined stiffness in the tangential lateral and axial direction, and the mount being connected to the respective mating bearings via the mount bearing points, and the mount bearing points having means which reduce the stiffness of the mount in the tangential, lateral or axial direction in the region of the mount bearing points;
wherein the means of the mount bearing points comprise regions in which the mount material is partly or wholly removed along the thickness of the mount; and
wherein a spacer washer is arranged between the mount bearing points and the associated mating bearings.

41. A device for the low-deformation mounting of an optical element in a mount with mount bearing points which are connected to respective mating bearings of a mating bearing element, wherein the respective mating bearings have means which reduce the stiffness of the mating bearing element in at least one predefined direction in the region of each mating bearing;
wherein the mating bearings are formed so as to correspond to the mount bearing points as claimed in one of the following:
a) wherein the mount being connected to respective mating bearings via mount bearing points, and the mount bearing points having means which reduce the stiffness of the mount in the tangential, lateral or axial direction in the region of the mount bearing points; and wherein the means of the mount bearing points comprise regions in which the mount material is partly or wholly removed along the thickness of the mount;
b) wherein the mount being connected to respective mating bearings via mount bearing points, and the mount bearing points having means which reduce the stiffness of the mount in the tangential, lateral or axial direction in the region of the mount bearing points;

and wherein the means of the mount bearing points comprise regions in which the mount material is partly or wholly removed along the thickness of the mount; and wherein the mount has three bearing points; and wherein the surface of the mount bearing point that faces the mating bearing comprises a plane or convex surface;

c) wherein the mount being connected to respective mating bearings via mount bearing points, and the mount bearing points having means which reduce the stiffness of the mount in the tangential, lateral or axial direction in the region of the mount bearing points; and wherein the means of the mount bearing points comprise regions in which the mount material is partly or wholly removed along the thickness of the mount; and wherein the mount is formed with a reduced thickness in the region of the mount bearing point by means of milled out portions in the direction of the mating bearing;

d) wherein the mount being connected to respective mating bearings via mount bearing points, and the mount bearing points having means which reduce the stiffness of the mount in the tangential, lateral or axial direction in the region of the mount bearing points; and wherein the means of the mount bearing points comprise regions in which the mount material is partly or wholly removed along the thickness of the mount; and wherein the mount bearing points are formed in one piece with the mount;

e) wherein the mount being connected to respective mating bearings via mount bearing points, and the mount bearing points having means which reduce the stiffness of the mount in the tangential, lateral or axial direction in the region of the mount bearing points; and wherein the means of the mount bearing points comprise regions in which the mount material is partly or wholly removed along the thickness of the mount; and wherein the stiffness of the mount in the tangential, lateral or axial direction in the region of the mount bearing points is reduced to less than 50%, preferably less than 20%, of the respective stiffness of the mount; or f) wherein the mount being connected to respective mating bearings via mount bearing points, and the mount bearing points having means which reduce the stiffness of the mount in the tangential, lateral or axial direction in the region of the mount bearing points; and wherein the means of the mount bearing points comprise regions in which the mount material is partly or wholly removed along the thickness of the mount; and wherein the mount bearing point comprises a cylindrical or conical recess.

42. The device as claimed in claim 38, wherein the respective mating bearings physically contact the mount at the mount bearing points.

43. A device for the low-deformation mounting of an optical element in a mount, the mount in each case having a predefined stiffness in the tangential lateral and axial direction, and the mount being connected to respective mating bearings via mount bearing points, and the mount bearing points having means which reduce the stiffness of the mount in the tangential, lateral or axial direction in the region of the mount bearing points; and wherein the stiffness of the mount in the tangential, lateral or axial direction in the region of the mount bearing points is reduced to less than 50%, preferably less than 20%, of the respective stiffness of the mount.

44. The device as claimed in claim 43, wherein the mount is formed with a reduced thickness in the region of the mount bearing point by means of milled out portions in the direction of the mating bearing.

45. The device as claimed in claim 43, wherein the mount bearing point comprises a cylindrical or conical recess.

\* \* \* \* \*

UNITED STATES PATENT AND TRADEMARK OFFICE
CERTIFICATE OF CORRECTION

PATENT NO. : 7,471,469 B2  Page 1 of 1
APPLICATION NO. : 11/233846
DATED : December 30, 2008
INVENTOR(S) : Franz Sorg et al.

It is certified that error appears in the above-identified patent and that said Letters Patent is hereby corrected as shown below:

Sheet 3 of 4, Fig. 3, delete "19,19" and insert --19,19'--.

Column 9, line 25, Claim 28, delete "1" and insert --1,--.

Signed and Sealed this

Third Day of March, 2009

JOHN DOLL
*Acting Director of the United States Patent and Trademark Office*